(12) United States Patent
Thiruvengadam et al.

(10) Patent No.: US 9,535,119 B2
(45) Date of Patent: Jan. 3, 2017

(54) DUTY CYCLE BASED TIMING MARGINING FOR I/O AC TIMING

(71) Applicant: Intel Corporation, Santa Clara, CA (US)

(72) Inventors: Bharani Thiruvengadam, Beaverton, OR (US); Christopher Nelson, Gilbert, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/319,528

(22) Filed: Jun. 30, 2014

(65) Prior Publication Data

US 2015/0377967 A1 Dec. 31, 2015

(51) Int. Cl.
*G01R 31/30* (2006.01)
*G01R 31/317* (2006.01)

(52) U.S. Cl.
CPC ..... *G01R 31/31715* (2013.01); *G01R 31/3171* (2013.01)

(58) Field of Classification Search
CPC ............... H05B 39/048; H05B 41/3924; G06F 17/5054; G01R 31/3171; G01R 31/31715; G01R 31/31813; G01R 31/318307
USPC .................................................. 714/724, 745
See application file for complete search history.

(56) References Cited

U.S. PATENT DOCUMENTS

| | | | |
|---|---|---|---|
| 6,348,826 B1 * | 2/2002 | Mooney | G01R 31/3016 327/231 |
| 7,171,321 B2 | 1/2007 | Best | |
| 7,423,454 B2 | 9/2008 | Stojanovic et al. | |
| 8,091,056 B1 * | 1/2012 | Campbell | G06F 17/5054 716/102 |
| 9,208,836 B1 | 12/2015 | Ware | |
| 9,218,575 B2 | 12/2015 | Mozak et al. | |
| 2004/0123193 A1 | 6/2004 | Gass | |
| 2005/0025190 A1 * | 2/2005 | Frisch | G01R 31/3187 370/503 |
| 2006/0031725 A1 | 2/2006 | Kang | |
| 2007/0067686 A1 | 3/2007 | Khondker et al. | |
| 2007/0241799 A1 | 10/2007 | Minzoni et al. | |

(Continued)

FOREIGN PATENT DOCUMENTS

WO 03025599 3/2003

OTHER PUBLICATIONS

International Search Report and Written Opinion for PCT Patent Application No. PCT/US2015/037990, Mailed Sep. 22, 2015. 12 pages.

*Primary Examiner* — David Ton
(74) *Attorney, Agent, or Firm* — Compass IP Law

(57) ABSTRACT

Testing I/O (input/output) eye width for an interface with an inverted modulated strobe or clock signal. An I/O interface includes multiple signal lines, each with a hardware I/O buffer with timing characteristics. A system generates a strobe signal with a triggering edge that triggers a write, and a trailing edge that is modulated by adjusting the duty cycle of the strobe signal. The system inverts the modulated strobe signal to generate an inverted strobe signal, wherein the inverted strobe signal has a modulated triggering edge generated from inverting the modulated trailing edge. The device under test writes test data based on the triggering edge of the original strobe signal and reads test data based on the triggering edge of the inverted strobe signal.

24 Claims, 8 Drawing Sheets

(56) References Cited

U.S. PATENT DOCUMENTS

| | | | |
|---|---|---|---|
| 2011/0018507 A1* | 1/2011 | McCloy-Stevens | H02M 3/1588 |
| | | | 323/271 |
| 2015/0222303 A1 | 8/2015 | Stojanovic et al. | |
| 2015/0324265 A1* | 11/2015 | Nelson ................. | G06F 11/221 |
| | | | 714/43 |
| 2015/0357018 A1 | 12/2015 | Best | |

* cited by examiner

DUTY CYCLE BASED TIMING MARGINING FOR I/O AC TIMING

FIELD

Embodiments of the invention are generally related to device I/O (input/output), and more particularly to testing I/O signaling timing parameters.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright© 2014, Intel Corporation, All Rights Reserved.

BACKGROUND

Computing and electronic devices continue to get smaller, even while performance remains the same or increases. Smaller computing and electronic devices are made possible by smaller electronic components due to smaller geometries on the components. Manufacturing processes can currently generate components that have a large number of I/O (input/output) signal lines in an I/O interface, and with a smaller pitch between the signal lines than is practically possible to contact for direct AC and DC performance testing. DC (direct current) performance settings refers to biasing and/or voltage levels associated with the signaling, while AC (alternating current) performance refers to the timing of the edges of the signals over the interface, where testing for AC performance can be referred to as margining.

The decreasing size of the electronic components and the pitch between signal lines increases the difficulty of testing the devices. For many devices, the number of signal lines and the small pitch makes it impractical to directly test the I/O interface. A lack of direct testing has increased the risk that device manufacturers will not be able to achieve ultralow defects per million (DPM) targets with traditional testing. One specific area of technology in which such risks are currently being presented is with wide interface memory devices. Available testing methods are not practical in mass production (e.g., HVM (high volume manufacturing)) where the time required to test devices serially would be prohibitive.

The manufacturers of the electronic component chips (e.g., such as DRAM (dynamic random access memory) suppliers) test the I/O interface or the I/O signal array. Traditional methods for testing I/O AC timing are structural testing that attempt to exercise a particular electronic component block. Structural testing requires different tests for each different component and/or element of a circuit block. Structural testing does not capture noise, making the testing results optimistic if not outright incorrect. Traditional testing relies on margining on a single data bit within a burst pattern. Traditional testing methods screen for outliers in AC timings (e.g., setup and hold timing margins at the receiver), but are very slow and costly.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, and/or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Figure 1:
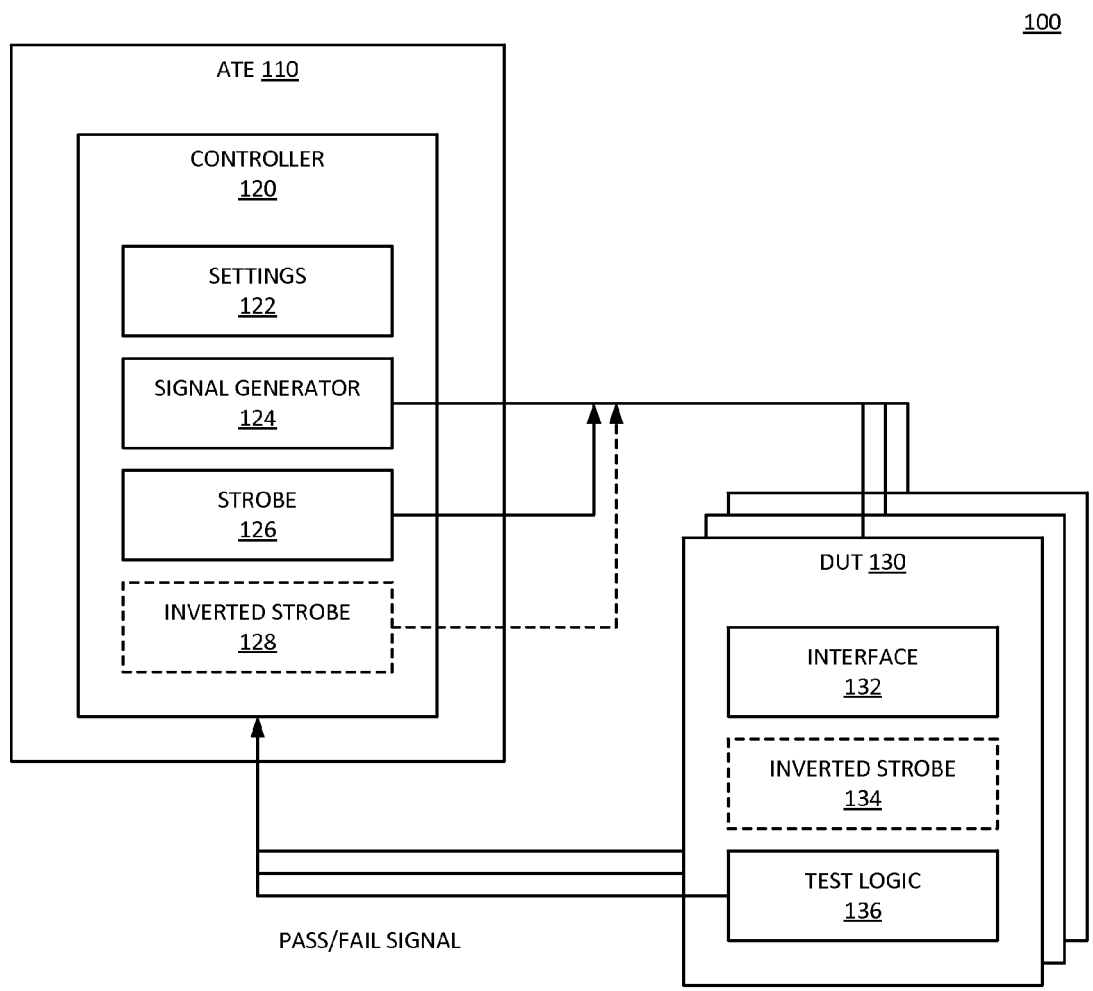
FIG. 1 is a block diagram of an embodiment of a system that provides duty cycle based margining for indirect I/O testing.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, a system enables the testing of I/O (input/output) eye width for an interface. The system generates an inverted modulated strobe or clock signal to trigger receive operation while triggering transmit operation on the non-inverted strobe or clock signal. An I/O interface includes multiple signal lines, each with a hardware I/O buffer with timing characteristics. The AC (alternating current) margining of the I/O interface refers to the timing of the edges of the triggering signals. The testing can detect outliers by compiling an expectation of eye width size for a particular device under test (DUT), and comparing operation of I/O channels against the expected eye width size. It is expected that the majority of channels created in the same circuit processing will result in approximately the same I/O eye width, with minimal numbers of outliers.

In accordance with what is described herein, the testing is functional, and tests the functional ability of the DUT instead of strictly structural testing that evaluates each separate operation of each separate component. With functional testing, the test system sends test data and evaluates whether the DUT can write and read the test data with various different timing settings. Certain timing settings are expected to cause failures in the I/O, while other timing settings are expected to cause passing operation. The use of failure and passes is described in more detail below. Outlier circuits can be circuits that record a pass when they are expected to fail, and/or to record a failure when they are expected to pass.

The test system generates the strobe signal or clock signal as well as the test data. By having the test system generate the clock signals, the DUT does not have to include circuitry to generate timing signals, which can save real estate and cost. Additionally, the clock signals from the test system enable the functional testing of the I/O eye width, as described in more detail below. The test system strobe signal has a triggering edge that triggers transmit or writing, and a trailing edge that is modulated by adjusting the duty cycle of the strobe signal. In one embodiment, the triggering edge is a rising edge, and the trailing edge is the falling edge of the strobe; however, it will be understood that a system can be designed to trigger on the falling edge. The system inverts the modulated strobe signal to generate an inverted strobe signal, wherein the inverted strobe signal has a modulated triggering edge generated from inverting the modulated trailing edge. Either the test system or the device under test can generate the inverted strobe signal. The device under test writes test data based on the triggering edge of the original strobe signal and reads test data based on the triggering edge of the inverted strobe signal. In one embodiment, the device under test includes error detection circuitry with which to record I/O errors.

In one embodiment, the margining testing allows the adoption of a different pass/fail methodology than what is traditionally used. Instead of directly trying to measure operation of particular circuit elements, or directly measuring eye width, a system can separately test the leading edge of the I/O eye and trailing edge of the I/O eye. It will be understood that the leading edge of the eye and the trailing edge of the eye are not to be confused with triggering or leading edge of a clock signal and the trailing edge of the clock signal, although they could align. In a double data rate implementation, both the leading and trailing edge of the eye align with leading or triggering edges of a clock signal. In industry, the leading edge is typically referred to as the "left" edge, and the trailing edge is the "right" edge, referring to observing an I/O eye pattern diagram. By way of clarity in description, and not by way of limitation, the "left edge" and "right edge" terminology is used herein with reference to the I/O signaling eye.

In one embodiment, the system employs a first fail methodology to identify a passing right edge of the eye, which indicates a hold time for the data signal. In one embodiment, the system employs an all pass methodology to identify a passing left edge of the eye, which indicates a setup time for the data signal. In one embodiment, the system tests the right edge of the eye prior to testing the left edge of the eye. A first fail methodology refers to testing in which the first failure detected is used to indicate the longest time that can be used for the right edge of the eye. The longest time can be referred to as the longest hold time allowed. An all pass methodology refers to a testing in which the point in time when all circuits record a pass is used to indicate the earliest time that can be used for the left edge of the eye. The earliest time can be referred to as the shortest setup time allowed.

Between the first fail of the right edge and the all pass of the left edge is a metastability window between the setup and hold time windows that is typically assumed to be small. That assumption traditionally results in the window being ignored for test purposes. The metastability window in a standard flip flop could be a few picoseconds wide and can vary as a function of process, voltage, and temperature. Thus, it will be understood that failure to meet the hold time does not necessarily mean that setup time for the following data is met once all I/O channels fail the hold time. All pass methodology makes no assumption about the width of the metastability window, thus removes optimistic assumption about margin measurements.

It will be understood that when the test system modulates the duty cycle of the test clock, there is no need for an on-chip clock to perform I/O margining. The test system can allow automation and sequencing in the testing, which is compatible with HVM (high volume manufacturing). Other methods of testing are too slow, too bandwidth intensive, and/or otherwise not well suited for testing many devices in parallel. The testing described herein is based on dynamically adjusting skew between the transmit clock and receive clock to adjust the eye width, and therefore functionally test the operation of the I/O interface. Thus, dynamically adjusting skew can perform AC margining for the I/O interface.

The testing as described herein can be automated, and thus can be executed on electronic chips themselves, even without direct probing each I/O channel. In one embodiment, the device under test includes multiple device chips in wafer testing. In one embodiment, the device under test includes a system on a chip (SoC), which includes multiple different devices processed on the same substrate. In one embodiment, the device under test includes a multichip package, which includes multiple different chips combined within a single package, typically connected by high bandwidth interfaces.

In addition to being flexible in its application to many different types of chip packaging, the testing can be applied to different types of I/O as well. Data I/O is typically bidirectional, which means that the I/O ports have both write and read capability. Testing that triggers transmit on the triggering edge of a clock signal and that triggers receive on a modulated triggering edge of the clock signal inverted will take advantage of both write and read capability. It will be understood that some I/O lines or pins are unidirectional (e.g., command/address lines (CA) lines), and may not normally be able to take advantage of such testing. In one embodiment, unidirectional lines include a dummy transmitter or receiver that can be shut off for operation of the circuit. Thus, the dummy I/O could be used solely to test the I/O port and then shut off.

In one embodiment, testing can be performed on signal lines together as a signal group or a group of multiple signal lines, which can refer to multiple signal lines that share a common timing signal or a common clock. For example, in certain memory devices, there can be a number of DQs (data signal) and associated DMI signals that share a common pair of DQS (clock strobe) signals. The indirect testing with the groups of signal lines can allow simultaneous testing of a valid eye width of data signals for all signal groups of all channels within an interface. Additionally, the testing can enable the testing of multiple devices, each with a separate I/O interface, in parallel or concurrently. The testing can allow the testing of multiple or all circuit die of a semiconductor wafer. A single test data sequence can be distributed to multiple devices, to each channel on each device, to each group on each channel, and to each signal line of each group. By accumulating pass/fail information for the group, the system can significantly reduce the bandwidth required to send test results back to the test source. Instead of indicating pass or fail on each data bit for each signal line, a group can send back a value indicating the number of passing and failing bits.

The system can test the data eye width by adjusting one or more timing settings for multiple testing iterations. For example, the test data can be distributed to all signal lines for one timing setting, and then distributed to all signal lines again for a different timing setting. The test data can be the identical sequence of bits, but with different I/O interface parameters controlling how the signal lines receive and sample the signal. More particularly, as described herein, the trailing edge of a strobe signal can be modulated, and the signal inverted to provide a modulated leading edge of a strobe or clock signal. The system can generate an error result for each timing setting (e.g., different duty cycles, which causes different eye width sizes), and can thus determine the width of the eye by monitoring the number of errors received by the signal groups for the different settings. The test system can measure the width of the eye as a composite data eye size of all signals with a signal group. The system can count the number of test iterations which capture the correct data on all I/O buffers or pins of the signal group for all data cycles, which can then provide an indirect eye size width. In one embodiment, signal groups and entire devices (I/O interfaces) can be compared against each other to determine if they fall within a statistical pattern of errors. For example, the system can determine that a signal group passes the test when its number of errors is within a low and high threshold. Signal groups whose number of errors falls outside the target range can be deemed to have failed the test.

In one embodiment, such testing can be particularly useful for testing emerging memory designs. For example, memory designs such as WIO2 (Wide Input/Output version 2, JESD229 December 2011, available from JEDEC (Joint Electronic Device Engineering Council)), and HBM (high bandwidth memory, JESD235 October 2013, available from JEDEC) DRAM designs, or other memory devices that have wide I/O interfaces. Such devices have a large number of signal lines in the device interfaces, and the feature size of the manufacturing techniques used to produce such devices can result in devices that cannot practically be tested using traditional direct contact methods. For example, WIO2 includes up to eight 64-bit data channels and HBM includes up to eight 128-bit data channels. The testing described herein can enable memory device suppliers/manufacturers to effectively screen for I/O defects in production testing that is compatible with HVM. It will be understood that in addition to memory device designs, the testing described herein can be applied to logic devices and/or SOCs (system on a chip) that are designed with wide I/O interfaces. In one example, certain logic devices and SOCs are designed to mate with emerging wide interface memory devices. Thus, the testing described herein provides an AC margining solution for wide interface devices without having to probe the devices for a direct contact testing approach. The AC margining described can be broadly applied to any I/O interface and is not limited to memory specific design alone.

FIG. 1 is a block diagram of an embodiment of a system that provides duty cycle based margining for indirect I/O testing. System 100 includes one or devices under test (DUTs) 130 that have I/O interfaces to be tested with duty cycle based timing margining. Device under test 130 can be a memory device, or other component with an I/O interface to be indirectly tested. The I/O interface of device under test 130 can include a multiple signal lines organized as signal groups. In one embodiment, devices under test 130 are individual circuit die. In one embodiment, the devices can be tested while still together as a semiconductor wafer (e.g., before being separated and packaged).

In one embodiment, system 100 concurrently measures a valid I/O timing eye margin on a signal group basis for interface 132. The testing can provide the ability to concurrently measure the I/O performance of all signal groups with minimal per signal group overhead by manufacturing automatic test equipment (ATE). In one embodiment, all devices under test (e.g., all DRAM die or other devices) contacted in one wafer prober stepping (e.g., 128 die at a time) can be tested concurrently.

System 100 includes automated test equipment (ATE) 110, which represents test equipment or a test system. The test system can be understood as the test data source, and also the source of a test clock. Automated test system 110 includes controller 120, which represents logic (hardware and/or software) to execute the I/O testing. Controller 120 can generate test data and a modulated clock. In one embodiment, controller 120 includes settings 122, which provides timing settings for I/O with devices 130 to be used during the testing. At least one of the timing settings that controller 120 controls is duty cycle of a trailing edge of the clock signal. Altering the duty cycle of the clock signal allows system 100 to invert the clock signal to generate a modulated triggering edge. In one embodiment, the automated test equipment generates the inverted signal and sends both the inverted and non-inverted clock signals to device under test 130. In one embodiment, device under test 130 generates the inverted clock signal from the non-inverted clock signal received from controller 120. By changing the I/O timing parameters (settings 122), system 100 can determine the proper eye size for I/O. In one embodiment, settings 122 include settings for both transmit (TxClk) and receive (RxClk) clocks, both of which can have non-inverted and inverted signals. TxClk can be referred as a launch clock, and RxClk can be referred to a capture clock. In one embodiment, settings 122 set the timing between TxClk and RxClk, or the skew positions of one clock signal relative to the other.

Controller 120 includes signal generator 124, which generates test data to provide to the one or more devices under test 130. Signal generator 124 can generate a sequence of test data, which includes particular bits or bit patterns to test the I/O performance of the signal lines being tested. The test data sequence can be dozens of bits long, or thousands of bits long. In one embodiment, controller 120 sends the same test data sequence pattern each time over multiple test iterations, where each test iteration tests different timing settings 122. In one embodiment, controller 120 sends a single query at the end of each test iteration to receive a pass/fail indication or pass/fail result from each signal group and/or from each device 130.

As mentioned above, controller 120 generates a non-inverted clock signal, represented by strobe 126. In one embodiment, controller 120 also generates inverted strobe 128. The strobe signal or signals are sent along with data to device under test 130. In one embodiment, the clock signals provided by controller 120 of automated test equipment 110 are expected to have inherent edge placement accuracy errors. In one embodiment, timing edge placement accuracy of the TxClk or RxClk is not a relevant factor to the performance of a loopback test circuit when the test data sequence is based on scanning the skew between the two clocks over a wide range of data and measuring the valid data eye size. The placement accuracy errors can thus be irrelevant to the testing, seeing that the testing can still accurately measure the width of the signal group data valid eye for I/O instead of a specific timing placement.

In one embodiment, the duty cycle of the strobe signal used for TxClk is dynamically adjusted. By adjusting the trailing edge of the clock, there will not be any effect on the triggering for transmit. However, by using an inverted strobe signal for RxClk, the changing of the duty cycle will modulate the leading edge of the receive clock, which will dynamically adjust the edge placement of RxClk with respect to TxClk. Thus, system 100 can control skew of the clock signals relative to each other, and use the relative offsets to test for eye width. In one embodiment, controller 120 can use different edge placement resolution to change the differences in the step size for different settings 122. Coarse RxClk edge placement step size limits resolution of the eye width measurement. Finer resolution step size leads to more test iterations and longer test time, but improves the accuracy of the eye width measurement. For some devices 130, relatively course resolution may provide a sufficient eye width measurement. For other devices (such as certain DRAMs), devices 130 may have a small performance margin requiring a finer resolution. Thus, different embodiments of system 100 can measure the eye width size margin with, for example, 8 different skew settings, while others can measure with 16 or more different skew settings. Clock jitter can also reduce the measured data valid eye width. Jitter sources include jitter in the clocks delivered from controller 120 to devices 130, and jitter added in the internal routing within devices 130. Proper test circuit design and device layout can reduce the jitter.

Devices 130 include interface 132, which refers to the I/O to be tested. In one embodiment, the device under test generates inverted strobe 134 from strobe signal 126 received from controller 120, instead of having automated test equipment 110 generate the inverted clock signal. It will be understood that such an implementation will require additional logic on the devices under test. Devices 130 also include test logic 136, which represents one or more logic circuits in each device under test to perform error detection. The error detection enables the devices to determine whether or not I/O interface 132 is operating correctly. In one embodiment, devices 130 report the number of errors and/or the number of passes detected during a testing sequence or test iteration. Automated test equipment 110 can then determine whether the test results provided by the group or the device indicate a pass or a fail of the testing.

With the test data generated by signal generator 124, the clock signal provided by strobe 126, the inverted clock signal provided by either inverted strobe 128 and/or inverted strobe 134, and test logic 136, system 100 can test for AC timing defects without direct connection or direct probing of device under test 130 by automated test equipment 110. Settings 122 enables the system to provide timing margining without requiring on-die delay locked loops (DLLs) or phase locked loops (PLLs) on device under test 130. Additionally, in one embodiment, system 100 does not require delay lines, either compensated or uncompensated, if the timing testing is provided by relative offsets between two controlled clock signals (TxClk and RxClk as described above). Thus, I/O testing in system 100 can be accomplished with lower cost and lower power than traditional testing.

Figure 2:
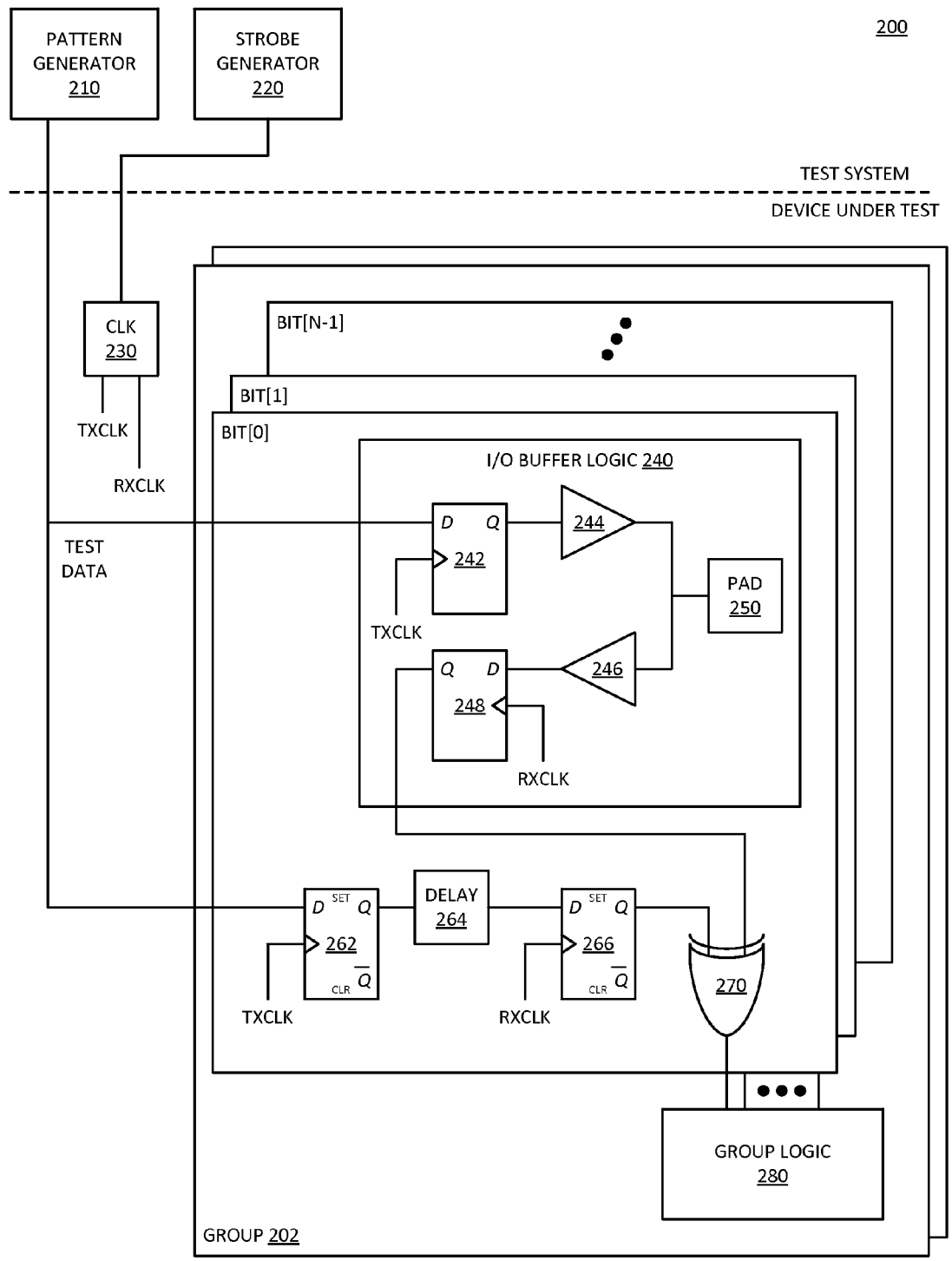
FIG. 2 is a block diagram of an embodiment of a system that provides duty cycle based margining for I/O testing where the device under test generates an inverted modulated clock signal.

FIG. 2 is a block diagram of an embodiment of a system that provides duty cycle based margining for I/O testing where the device under test generates an inverted modulated clock signal. System 200 can be one example of elements of system 100 of FIG. 1, and provides one example of details of clock and data distribution and use within a device under test. The testing in system 200 is based on an assumption that most defects that cause an AC timing margin loss can be measured with a linked driver/receiver loopback connection. It will be understood that such an assumption may not be valid for all devices under test. Thus, system 200 illustrates certain specific examples which are not necessarily present in every system implementation. Such a loopback configuration can work well with bidirectional I/O ports. In an embodiment for testing unidirectional I/O ports, either a receiver or a transmitter can be a dummy circuit used for testing, and then disabled for operation. In one embodiment, the configuration of the system includes an error detection mechanism for each individual I/O buffer (signal line or I/O port) and for each signal line group to have an associated group error detection mechanism to report back accumulated results. It will be understood that the specific error detection logic represented in system 200 can be replaced by other detection logic.

In one embodiment, the test system triggers a test mode, and the circuit device under test that includes Bit[0] through Bit[N−1] enters a test mode in response to the trigger. In one embodiment, part of entering the test mode includes resetting counters and/or other test components. Source pattern generator 210 is a test source that generates test data. In one embodiment, the test data can be referred to as a test data word, which refers to the pattern or sequence of test data bits to be applied to the I/O for testing. In one embodiment, the test data includes an output from an LSFR (linear feedback shift register) to create a test pattern. System 200 distributes the test data to multiple different signal groups 202 and can distribute the test signal to multiple different devices under test. Each device and each signal group receives the signal and reports back pass/fail information to the test system.

The test system also generates a strobe signal with strobe generator 220. In one embodiment, the test system generates both a launch clock signal (TxClk, a non-inverted clock signal) and a capture clock signal (RxClk, inverted from the non-inverted clock). In one embodiment, the test system only generates the TxClk, and the device under test generates RxClk from TxClk with clock logic (CLK) 230. The test system modulates the trailing edge of TxClk by adjusting the duty cycle of the strobe. It will be understood that modulating the trailing edge of the signal will not affect the transmit clock, which triggers on a leading edge of the clock. However, modulating the trailing edge and then inverting the clock signal results in a modulating leading edge for RxClk. In one embodiment, the clock signals are distributed and routed from the test system via clock logic 230 to the respective signal groups and circuit components without consideration of tightly controlled skew or flight time.

In one embodiment, the test system will generate multiple test iterations to measure a valid eye width, and thus will iterate through various different I/O timing settings. More particularly, the test system applies different duty cycles to strobe generator 220 to create TxClk with a faster or slower trailing edge. In one embodiment, the test system generates a number of test iterations equal to a number of duty cycle steps to be used to test the I/O eye width with the desired resolution. A test iteration refers to a few or many cycles of data words or a test sequence sent to and received by a signal group using a given timing setting or duty cycle. The changes to duty cycle adjust the skew setting between TxClk and RxClk as applied at the device under test. For each test iteration, the test system can set the particular timing setting and reset error tracking components. In one embodiment, all signals in the signal group must correctly receive the data for all cycles of the test iteration to be considered to have passed for that test iteration.

The device under test is shown to have N bits or N pins in signal group 202 detailed in system 200. N can be any number of signal lines that share a clock signal. It will be understood that the clock signal shared by the signal group is not directly the strobe generated by the test equipment, but refers to a clock or timing signal used on the device to operate the signal lines, which comes from the strobe signal generated by the test system. The distinction points out that different bits or signal lines can operate on different absolute phase delays, but such delays should be applied equally to both TxClk and RxClk, which means the relative skew between the two clocks remains substantially constant. In one embodiment, not every signal group within an interface has the same number of signal lines. For example, the interface of the device under test of which the illustrated signal group is a part can have a signal group that has N+M bits, or N−M bits, where M is some other integer smaller than N. In an implementation where two signal groups of the same interface have different numbers of bits, the system may distribute the appropriate number of signals from generator 210 to match the number of bits in the signal group.

In one embodiment, each of the bits of the signal group is associated with an I/O buffer, shown by I/O buffer logic 240. In one embodiment, buffer 240 is a standard I/O buffer, meaning that there are not necessarily any changes needed to the I/O buffer logic to perform the testing described herein. As shown in system 200, one embodiment of buffer 240 receives the test signal at receive latch 242, and buffers the signal from the output of latch 242 with amplifier 244 to pad 250. Pad 250 could alternatively be referred to as a pin or other hardware element that interfaces internal logic with an external device over a signal line. As configured in the test mode, buffer 240 can be in a loopback configuration, where pad 250 provides the bit received as an output, by sending the bit through amplifier 246 to latch 248. As illustrated, TxClk triggers the operation of latch 242, and RxClk triggers the operation of latch 248. In one embodiment, each new cycle or bit of the test data is launched with a rising edge of TxClk rising edge, and data capture for that bit is triggered with a rising edge of RxClk.

The output of latch 248 for testing can be outputted to XOR gate 270. In one embodiment, the output of latch 248 is compared at XOR gate 270 against the incoming bit as received from generator 210. It will be understood that managing the timing of the comparison at XOR gate 270 is important to getting proper error detection. Latches 262 and 266 can guarantee the timing for the testing to sure the bits read from pad 250 are tested against corresponding incoming bits. As seen, latch 262 is triggered by TxClk to feed its output into the input of latch 266. Latch 266 in turn is triggered by RxClk to feed its output to XOR gate 270, which should guarantee that the right bit is latched into XOR gate 270 to compare against the receiver/driver looped back bit. Each of bits[0] through [N−1] include a similar signal line error detection mechanism to determine if each specific I/O buffer received the test data bit correctly. The XOR gates of all signal lines feed into group logic 280. Thus, any error on any signal line the signal line group should trigger an error at group logic 280, which can include logic blocks as well as a counter to detect and accumulate pass/fail information. In one embodiment, group logic 280 can accumulate pass/fail information, and thus allow the return of pass/fail information to the test system after the test iteration, instead of needing to identify a pass/fail condition to the test system on each cycle.

In one embodiment, system 200 applies delay 264 between latch 262 and latch 266. In one embodiment, delay 264 can be selectively applied. For example, in one embodiment, the testing first detects a trailing edge of the data eye without using delay 264, and then tests the leading edge of the eye with delay 264. More details with respect to testing the leading and trailing edges of the I/O eye width are provided below.

Figure 3:
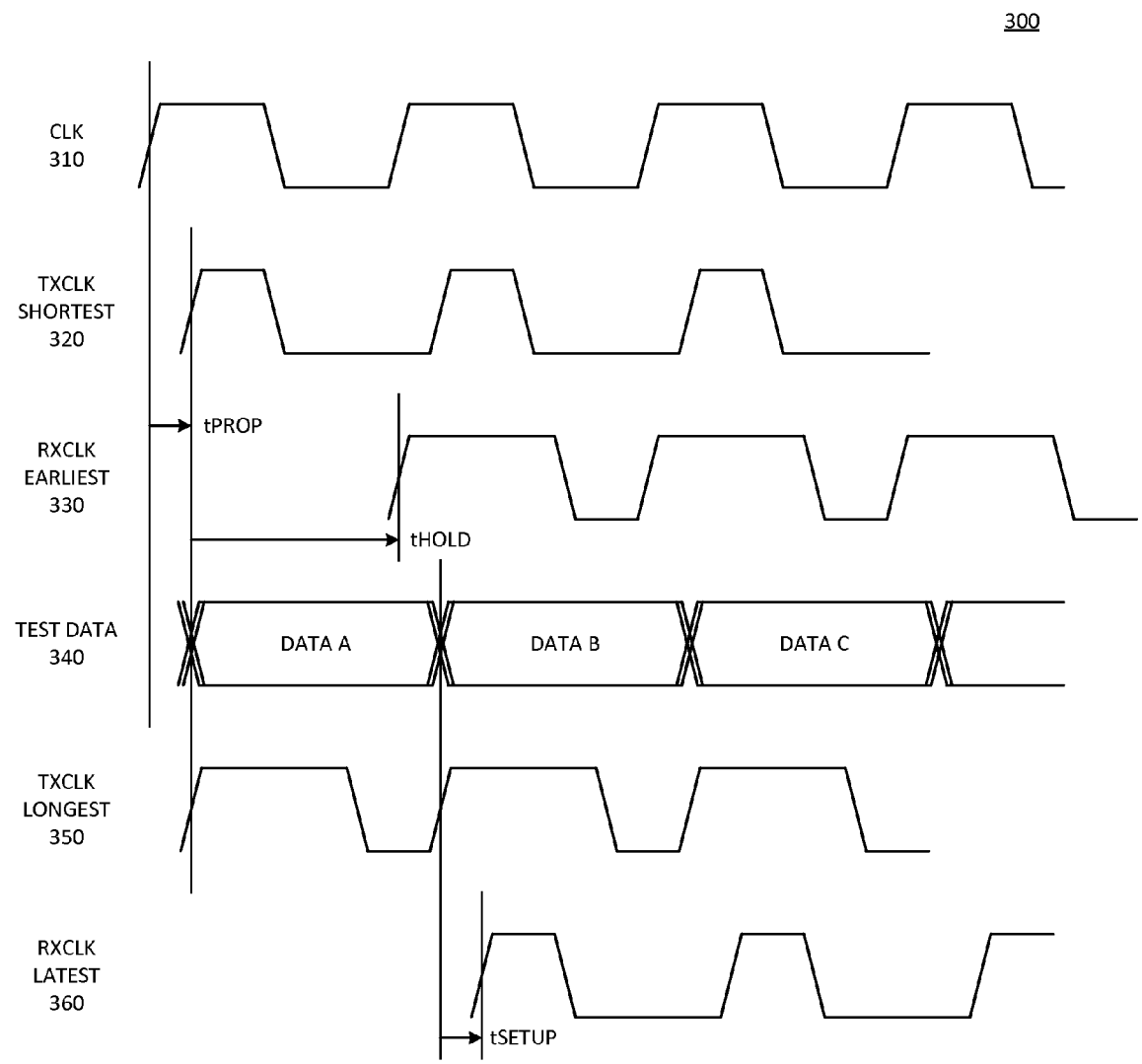
FIG. 3 is a timing diagram representation of an embodiment of a system that provides duty cycle based margining for I/O interface testing with different timing settings.

FIG. 3 is a timing diagram representation of an embodiment of a system that provides duty cycle based margining for I/O interface testing with different timing settings. Diagram 300 can be one example of timing for signals in accordance with system 100 and/or system 200. Diagram 300 illustrates relative timing for a system clock signal Clk 310, test data 340, and clock signals for the different levels of duty cycle modulation on the strobe signals. It will be understood that the relative timing is illustrated for purposes of explanation and is not necessarily shown to scale, and thus is not necessarily representative of actual relative timing for a real system. Test data 340 is illustrated as being an entire clock cycle wide in diagram 300. In an embodiment where a double data rate is used (such as in FIG. 4), there would be a data bit per half clock cycle.

Clock signal 310 is for comparison to point out the difference in duty cycle to the trailing edge of TxClk. In one embodiment, a test system sends TxClk but not system clock 310. In diagram 300 there are two versions of TxClk, TxClk shortest 320 and TxClk longest 350. These two clock signals correspond, respectively, to RxClk earliest 330 and RxClk latest 360. It will be observed that RxClk is an inverted version of TxClk. Thus, TxClk can be a non-inverted strobe signal, and RxClk an inverted strobe signal. TxClk shortest 320 and TxClk longest 350 are shown on the same diagram 300 with reference to test data 340 for purposes of explanation, but would not typically be sent together on separate signal lines (contrary to what might appear from diagram 300).

As illustrated, the test system sends data based on TxClk, as seen by the alignment of test data 340 with both TxClk shortest 320 and TxClk longest 350. It will be observed that the leading edge (a rising edge in diagram 300) is in the same relative position, but that the trailing edge comes sooner (in TxClk shortest 320) or later (in TxClk longest 350) depending on the duty cycle applied to the TxClk signal. In one embodiment, there are N−2 other duty cycle variations between signals 320 and 350, for a total of N duty cycle variations.

The test system sends data based on TxClk, but it will be observed that some propagation delay (tProp) exists between when the TxClk is sent (assumed to be on the leading edge of system clock 310) and when it triggers an operation within the device under test (as shown by the leading edges of signals 320 and 350). It will be understood that tProp can be longer or shorter than what is depicted in diagram 300. Propagation delay is a function of the path over which the signals will be distributed. Thus, tProp will be different for different signal groups. However, the same delay (or substantially the same delay) should also apply to RxClk, and thus the system can measure the difference between TxClk 320, 350 and RxClk 330, 360, respectively. Test data 340 represents the data signal at the pad of the I/O buffer. The delay tProp from when TxClk is originally sent from the test system (as shown by clock 310) indicates the time until the test data signal 340 is seen at the I/O buffer.

Referring first to signals TxClk 350 (TxClk longest) and RxClk 360 (RxClk latest), there is a setup time tSetup between the left edge of a previous bit of test data 340 and the leading edge of RxClk 360. The setup time is the minimum amount of time between data bits that the device under test needs to be able to detect the triggering edge of the next data bit. In diagram 300. As the duty cycle of TxClk 350 is adjusted to be smaller, the leading edge of RxClk 360 will come earlier commensurately. Thus, the leading edge of RxClk 360 will shift left in diagram 300 towards the left edge of Data B. By adjusting the duty cycle of the strobe signals, the test system can search for the left edge of Data B (the left edge of the eye width).

Referring to signals TxClk 320 (TxClk shortest) and RxClk 330 (RxClk earliest), there is a hold time tHold between the left edge of test data 340 and the leading edge of RxClk 330. The hold time is the minimum amount of time the data must be present for the device under test to perform a proper data capture. As the duty cycle of TxClk 320 is adjusted to be greater, the leading edge of RxClk 330 will come later commensurately. Thus, the leading edge of RxClk 330 will shift right in diagram 300 towards the right edge of Data A. By adjusting the duty cycle of the strobe signals, the test system can search for the right edge of Data A (the right edge of the eye width).

Traditional eye width testing uses a left fail and right fail methodology to detect the eye width edges. Traditional testing determines the left edge with a first fail methodology or search and the right edge with an all fail methodology or search. The test system corresponding to diagram 300 uses an all pass methodology or search for the left edge of the eye (a setup time or setup parameter violation). The test system corresponding to diagram 300 uses a first fail for the right edge of the eye (a hold time or hold parameter violation). It will be observed that the latest RxClk edge (RxClk 360) is used to test the left edge of Data B, while the earliest RxClk edge (RxClk 330) is used to test the right edge of Data A. Thus, in one embodiment, the system will need to use appropriately delay to compare the right data bit to the bit being tested.

Figure 4:
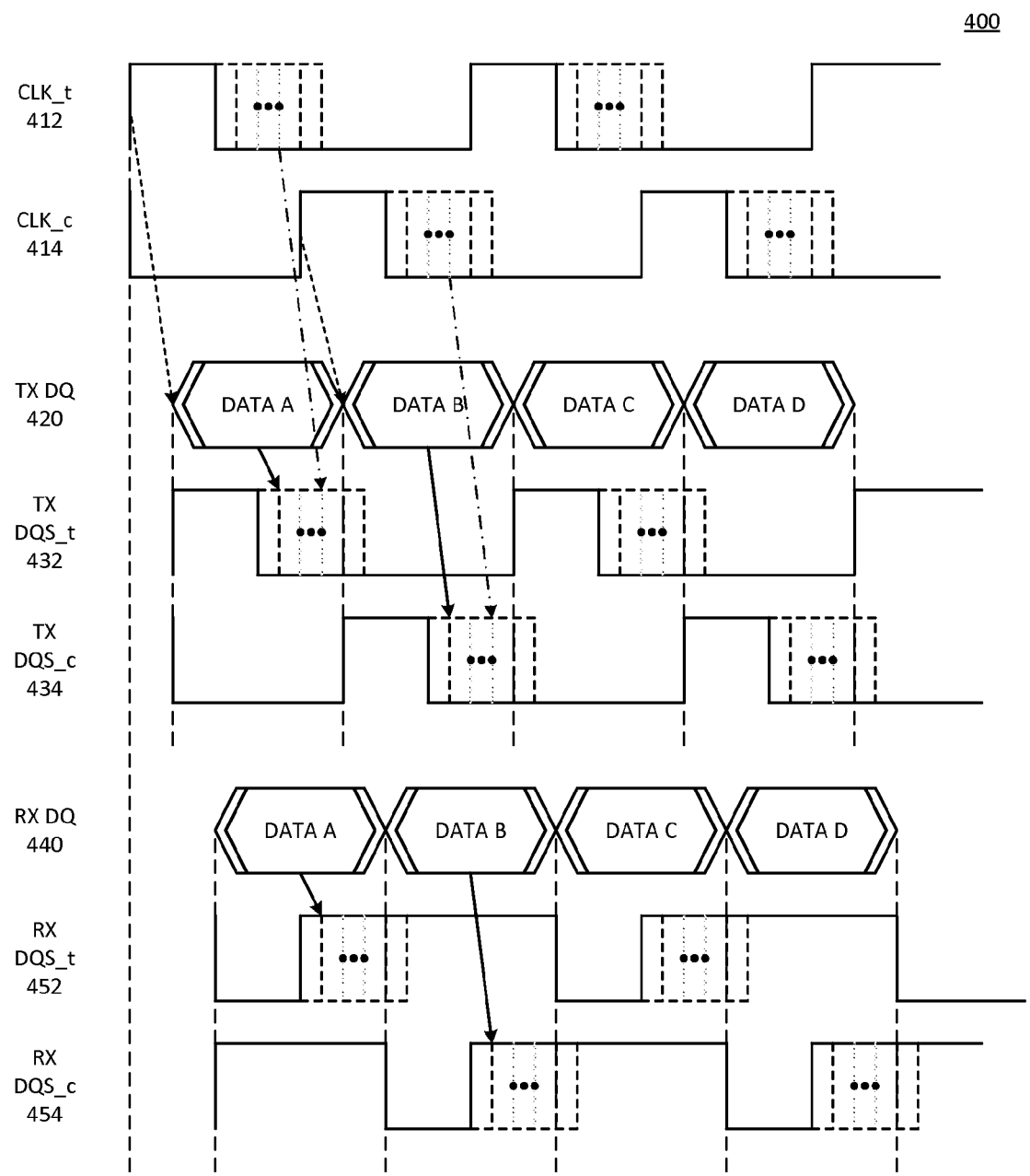
FIG. 4 is a timing diagram representation of an embodiment of testing hold time with duty cycle based margining.

FIG. 4 is a timing diagram representation of an embodiment of testing hold time with duty cycle based margining. Diagram 400 can be one example of timing for signals in accordance with system 100 and/or system 200. Diagram 400 illustrates relative timing, which is not necessarily shown to scale, but is meant for purposes of description. The transmit data and the receive data are shown as being a half clock cycle, where the leading edges of overlapping complementary clock signals are used to trigger the different data bit signals.

The timing signals are shown as differential signals, and thus the timing signals have complements. The system clock signal is illustrated as clock signal 412 (Clk_t) and its complement signal 414 (Clk_c). The clock signal differential pair (412, 414) can be a clock used by the test system to send data to a device under test. The clock signal can be referred to as an external reference clock, referring to external with respect to the device under test. There is a propagation delay between the clock signal (412, 414) and the transmit data (Tx DQ) 420, as well as a propagation delay between the clock signal and the receive data (Rx DQ) 440. Tx DQ 420 is edge aligned with the transmit clock differential pair signals 432 (Tx DQS_t) and 434 (Tx DQS_c). It will be observed that signals 432 and 434 are essentially duplicates of the external reference clocks 412 and 414.

Figure 5:
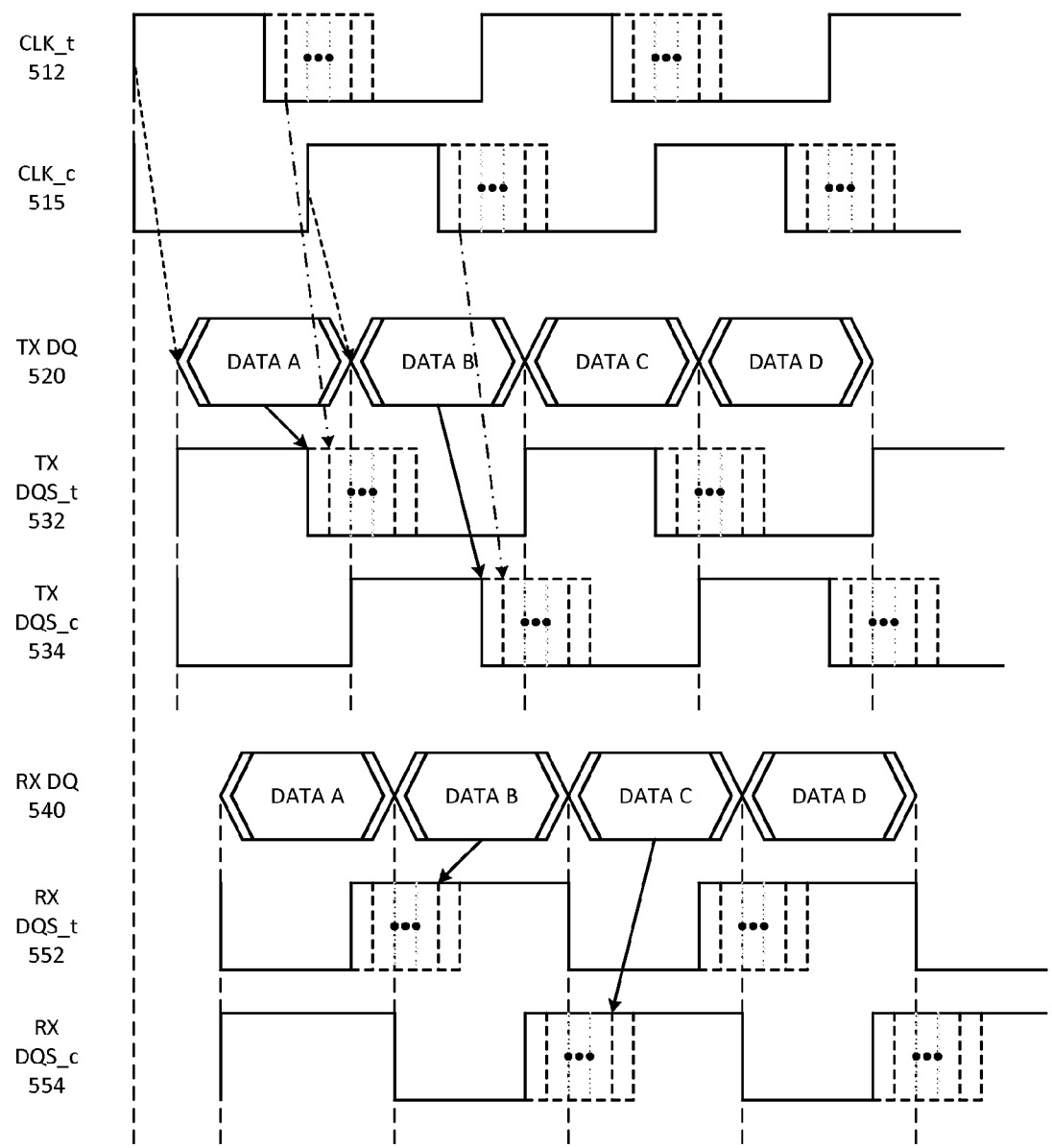
FIG. 5 is a timing diagram representation of an embodiment of testing setup time with duty cycle based margining.

In one embodiment, the margining or timing searches are all performed in the forward direction; thus, hold time margin validation as illustrated in diagram 400, can be performed before setup time margin validation as illustrated in diagram 500 of FIG. 5. Performing the hold time margin validation prior to setup time margin validation can save test time. In general, the testing modulates the duty cycle of the input reference and inverts the capturing strobe to be used at the receiver device, which can manipulate the phase relationship of the incoming data and strobe. In the embodiment of diagram 400, the rising edge of the clock signals is the leading edge or triggering edge.

In diagram 400, Tx DQS_t 432 has its rising edge aligned with the left edges of Data A and Data C. Similarly, Tx DQS_c 434 has its rising edge aligned with the left edges of Data B and Data D. Diagram 400 represents the falling edge of clocks Tx DQS_t 432 and Tx DQS_c 434 with multiple different lines. The multiple different lines represent different duty cycle settings, and hence the modulation of the falling edge of the clocks. For purposes of clarity, in diagram 400 the clock signals are shown with a smallest duty cycle in solid lines, and the additional lines are dashed lines to represent that one duty cycle setting is used at a time, and the additional duty cycle settings are used for other test iterations.

It will be observed that Rx DQS_t 452 and Rx DQS_c 454 are inverted versions of Tx DQS_t 432 and Tx DQS_c 434, respectively. As such, Rx DQS_t 452 and Rx DQS_c 454 have their rising edge modulated, and have a fixed falling edge. It will also be observed that whereas the rising edge of the Tx clocks are aligned with the left of their respective data bits, the modulated rising edge of the Rx clocks are more closely aligned with the right edge (the hold side) of the data bits. Thus, Rx DQS_t 452 has rising edges near the right edges of Data A and Data C, and Rx DQS_c 454 has rising edges near the right edges of Data B and Data D due to the inversion.

In one embodiment, a system associated with diagram 400 will initiate the duty cycle of the clock signals at its lowest value and increased over various test iterations. Correspondingly, the inverted clock first samples the hold time margin for Rx DQ 440. The duty cycle should be started at a point where it ensures to meet the setup time of the data. Increasing the duty cycle pushes the rising edge of the Rx DQS clocks closer to the right edge of the data bits. It will be understood that increasing the duty cycle and inverting the clock can provide better resolution and precision in eye measurement. If the system attempted to reduce the duty cycle to a small enough pulse to achieve the eye measurement resolution desired, it could actually negatively affect resolution by becoming too small to be reliable in a high-speed I/O setting. In contrast, increasing the duty cycle and inverting the signal results in a more precise measurement signal.

In one embodiment, the test system determines for each duty cycle setting if there is a failure at any I/O port or signal line. If the received data matches the expected data, the test system can increase the duty cycle execute the test again. In one embodiment, the testing is executed on signal groups, where a group of signal lines shares a common clock or strobe signal. For example, in WIO2, 16 DQ lines share a pair of complementary DQS strobes. In such a scenario, the test system can be configured to indicate a test failure even if only one of the 16 DQ signal lines fails the comparison. Such a methodology can be referred to as first fail, where any failure of any signal line (either any signal line in a group or any in a device) fails for a particular eye width setting. The test system can record the duty cycle setting in the previous passing iteration for margin calculations. It will be understood that the testing as described does not simply measure hold time, but can measure the combined impact of data-strobe skew, clock and data jitter, ISI (inter-symbol interference) if present on the channel, SSO (simultaneous switching output) noise of the transmitter drivers, and various mismatches and nonlinearities that exist in the circuits on-die and/or in the channel. Reference to hold-time margin can be a proxy to indicate the margin on the right side of the eye.

FIG. 5 is a timing diagram representation of an embodiment of testing setup time with duty cycle based margining. Diagram 500 can be one example of timing for signals in accordance with system 100 and/or system 200. Diagram 500 illustrates relative timing, which is not necessarily shown to scale, but is meant for purposes of description. The transmit data and the receive data are shown as being a half clock cycle, where the leading edges of overlapping complementary clock signals are used to trigger the different data bit signals. In one embodiment, diagram 500 is an extension of diagram 400 of FIG. 4, and could be the same diagram at a later time when larger duty cycles are used.

In one embodiment, the inverted modulated clock signals described with reference to diagram 400 can switch over from testing the hold time margin to testing setup time margin for the following data bit (for example, Data B after testing the right edge of Data A). As described above, in one embodiment, the right edge of the eye can be searched with a first fail methodology. It will be understood that continuing to increase the duty cycle after detecting the first failure will result in all failure, or all signal lines registering failure to properly receive the test data. Continuing to increase the duty cycle can then lead to a first pass for setup time on Data B. The test system can continue to increase the duty cycle until all signal lines indicate a passing iteration (meaning that all signal lines properly received the test data). As with diagram 400, the rising edges of the clocks in diagram 500 are to be understood as the triggering edge.

As illustrated, diagram 500 shows different timing signals and their complements. The system clock signal is illustrated as clock signal 512 (Clk_t) and its complement signal 514 (Clk_c). The clock signal differential pair (512, 514) can be a clock used by the test system to send data to a device under test. The clock signal can be referred to as an external reference clock, referring to external with respect to the device under test. There is a propagation delay between the clock signal (512, 514) and the transmit data (Tx DQ) 520, as well as a propagation delay between the clock signal and the receive data (Rx DQ) 540. Tx DQ 520 is edge aligned with the transmit clock differential pair signals 532 (Tx DQS_t) and 534 (Tx DQS_c). It will be observed that signals 532 and 534 are essentially duplicates of the external reference clocks 512 and 514.

In diagram 500, Tx DQS_t 532 has its rising edge aligned with the left edges of Data A and Data C. Similarly, Tx DQS_c 534 has its rising edge aligned with the left edges of Data B and Data D. Tx DQS_t 532 and Tx DQS_c 534 are modulated by adjusting the duty cycle of the clock signal. Rx DQS_t 552 and Rx DQS_c 554 are inverted versions of Tx DQS_t 532 and Tx DQS_c 534, respectively, and have modulated rising edges. It will also be observed that the rising edges of the Rx clocks in diagram 500 are aligned with the left edges of the data bits, but one bit offset. Thus, to properly capture and compare the right data bit, the test system can introduce a delay into the test logic to account for the shifting caused by the duty cycle change. As illustrated, Rx DQS_t 552 has rising edges near the left edge of Data B, and Rx DQS_c 554 has rising edges near the left edge of Data C.

In one embodiment, a system associated with diagram 500 will increase the duty cycle of the clocks over various test iterations. Correspondingly, the inverted clock will continue to shift to the right. As such, the Rx clocks are first expected to record all fail conditions, where the setup time parameter is violated for all signal lines. Eventually, over multiple iterations of testing, it is expected that the setup time parameter will be satisfied for all signal lines (all pass condition).

Thus, diagram 500 can be one example of a timing search for setup time or left side eye margin validation. In one embodiment, the failing point of hold time validation for Data A (for example, as shown in diagram 400) is used as a starting point for the setup time margin validation of Data B. The system can record the duty cycle that results in an all pass condition to identify the left edge of the eye. While not necessarily illustrated by diagrams 400 and 500, it has been found that the testing described where duty cycle is increased to test for hold time violation and then setup time violation, can reduce the range of duty cycle needed to be used. Such a process of testing does not require sampling the entire data bit to detect setup time on a data bit to hold time of the same data bit. Instead, the system can simply measure from just before to just after the metastable window between the right valid edge of one data bit to the left valid edge of the subsequent one.

Figure 6:
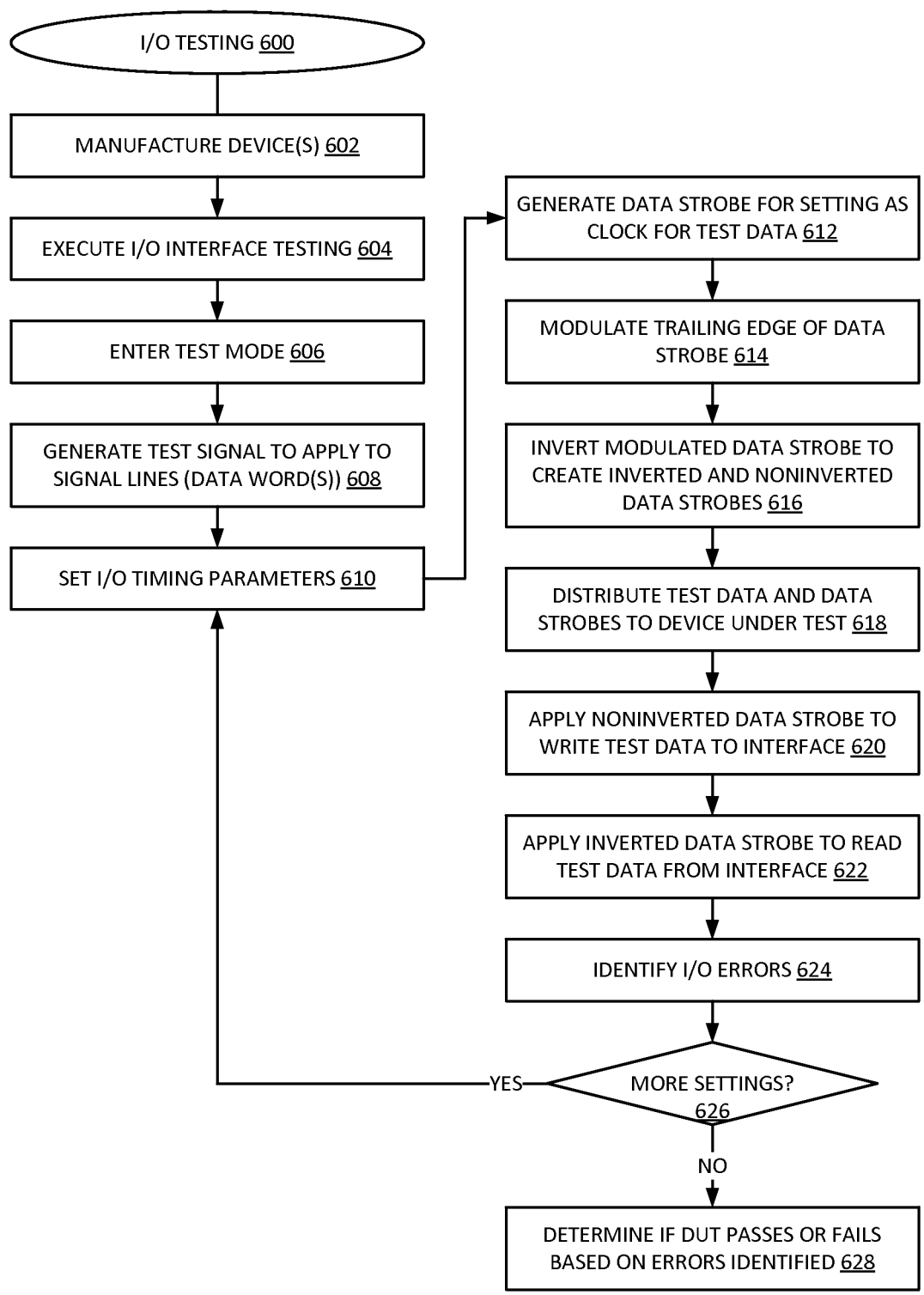
FIG. 6 is a flow diagram of an embodiment of a process for indirect I/O interface testing.

FIG. 6 is a flow diagram of an embodiment of a process for indirect I/O interface testing. A test system performs process 600 for I/O testing on one or more devices at a time, testing the signal lines of a device I/O interface. A manufacturer manufactures devices, 602, and executes I/O interface testing on the devices, 604. The I/O interface testing may be only one of multiple tests that the manufacturer performs.

In one embodiment, the test system enters a test mode and triggers the device under test to enter a test mode, 606. Entering the test mode can include resetting test counters used to track pass/fail information during the testing. The test system generates a test signal to apply to the signal lines of the device under test, 608. The test signal can be one or more data words or a sequence of bits intended to test the function of the I/O buffers/signal lines of the I/O interface.

In one embodiment, the test system sets I/O timing parameters for particular test iteration, 610. The test system generates a strobe signal for the particular timing setting as a clock for the test data of the test signal generated, 612. In one embodiment, the test system generates a strobe signal (e.g., a data strobe) and its complement for a differential signal. The test system modulates the trailing edge of the strobe signal by adjusting a duty cycle of the strobe signal, 614. In one embodiment, setting the I/O timing parameters is the same as setting the modulation for the strobe signal. The test system inverts the modulated strobe signal to create inverted and non-inverted strobe signals, 616. In one embodiment, the test system generates a differential non-inverted strobe signal and a differential inverted strobe signal. In one embodiment, a test controller generates the inverted strobe signal and sends it to the device under test. In one embodiment, the device under test generates the inverted strobe signal from the non-inverted strobe signal. In one embodiment, the strobe signal is applied to an inverting clock input of a logic device in the device under test.

In one embodiment, the test system executes multiple test iterations and loops through multiple test cycles for each duty cycle setting. The test system provides the test signal, which each device under test distributes to one or more signal groups of the I/O interface to apply to the signal lines of the interface, 618. The test system also sends one or more strobe signals for the device under test to use. The strobe signals allow the device(s) under test to generate pass/fail information for test data received through the I/O interface to enable the test system to determine a valid I/O eye width.

In one embodiment, the testing includes an I/O loop back test. In such an embodiment, each signal line applies the non-inverted strobe signal to write test data to the interface, 620, and applies the inverted strobe signal to read the test data from the interface, 622. Each signal line uses error detection to determine for each I/O buffer if the signal bit or signal cycle received correctly or if there were I/O errors, 624. In one embodiment, the test system accumulates pass/fail information, such as to determine an all pass condition or a first fail condition. At the end of an iteration, the test system will apply different test settings to apply a different duty cycle to the strobe signals. The testing is completed when all test settings have been applied. Thus, if the last iteration of testing has been reached, 626 NO branch, the testing system exits test mode and triggers the device(s) under test to exit test mode. The test system can then determine test results from pass/fail information provided by the device(s) under test. If there are more settings to apply, 626 YES branch, the testing system sets a new I/O timing parameter and executes another test iteration, 610.

Figure 7:
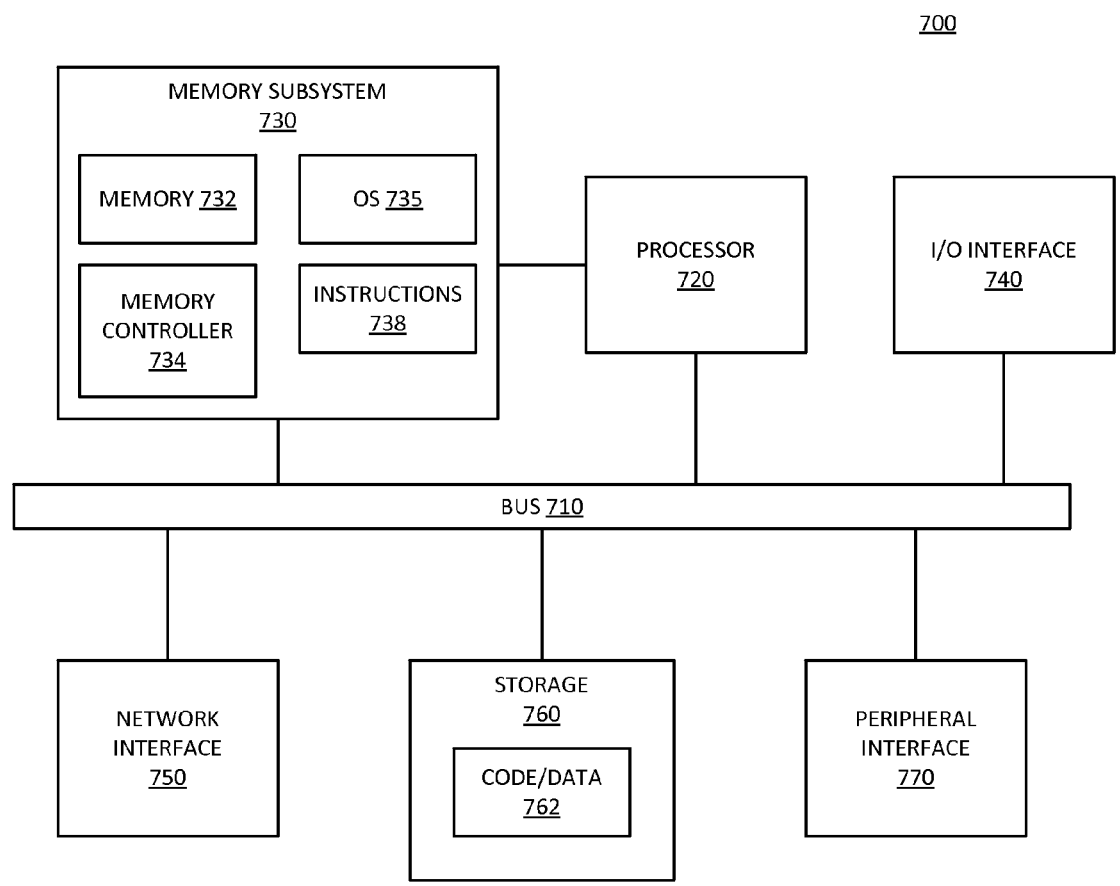
FIG. 7 is a block diagram of an embodiment of a computing system in which duty cycle based margining can be implemented.

FIG. 7 is a block diagram of an embodiment of a computing system in which duty cycle based margining can be implemented. System 700 represents a computing device in accordance with any embodiment described herein, and can be a laptop computer, a desktop computer, a server, a gaming or entertainment control system, a scanner, copier, printer, routing or switching device, or other electronic device. System 700 includes processor 720, which provides processing, operation management, and execution of instructions for system 700. Processor 720 can include any type of microprocessor, central processing unit (CPU), processing core, or other processing hardware to provide processing for system 700. Processor 720 controls the overall operation of system 700, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 730 represents the main memory of system 700, and provides temporary storage for code to be executed by processor 720, or data values to be used in executing a routine. Memory subsystem 730 can include one or more memory devices such as read-only memory (ROM), flash memory, one or more varieties of random access memory (RAM), or other memory devices, or a combination of such devices. Memory subsystem 730 stores and hosts, among other things, operating system (OS) 736 to provide a software platform for execution of instructions in system 700. Additionally, other instructions 738 are stored and executed from memory subsystem 730 to provide the logic and the processing of system 700. OS 736 and instructions 738 are executed by processor 720. Memory subsystem 730 includes memory device 732 where it stores data, instructions, programs, or other items. In one embodiment, memory subsystem includes memory controller 734, which is a memory controller to generate and issue commands to memory device 732. It will be understood that memory controller 734 could be a physical part of processor 720.

Processor 720 and memory subsystem 730 are coupled to bus/bus system 710. Bus 710 is an abstraction that represents any one or more separate physical buses, communication lines/interfaces, and/or point-to-point connections, connected by appropriate bridges, adapters, and/or controllers. Therefore, bus 710 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 710 can also correspond to interfaces in network interface 750.

System 700 also includes one or more input/output (I/O) interface(s) 740, network interface 750, one or more internal mass storage device(s) 760, and peripheral interface 770 coupled to bus 710. I/O interface 740 can include one or more interface components through which a user interacts with system 700 (e.g., video, audio, and/or alphanumeric interfacing). Network interface 750 provides system 700 the ability to communicate with remote devices (e.g., servers, other computing devices) over one or more networks. Network interface 750 can include an Ethernet adapter, wireless interconnection components, USB (universal serial bus), or other wired or wireless standards-based or proprietary interfaces.

Storage 760 can be or include any conventional medium for storing large amounts of data in a nonvolatile manner, such as one or more magnetic, solid state, or optical based disks, or a combination. Storage 760 holds code or instructions and data 762 in a persistent state (i.e., the value is retained despite interruption of power to system 700). Storage 760 can be generically considered to be a "memory," although memory 730 is the executing or operating memory to provide instructions to processor 720. Whereas storage 760 is nonvolatile, memory 730 can include volatile memory (i.e., the value or state of the data is indeterminate if power is interrupted to system 700).

Peripheral interface 770 can include any hardware interface not specifically mentioned above. Peripherals refer generally to devices that connect dependently to system 700. A dependent connection is one where system 700 provides the software and/or hardware platform on which operation executes, and with which a user interacts.

In one embodiment, one or more circuit components of system 700 include I/O interfaces that are functionally tested with duty cycle based margining to determine a proper I/O eye width. In one embodiment, elements of system 700 are included in an SOC or multichip package tested in parallel with other chips. In one embodiment, the components are tested by a test system that generates an inverted modulated strobe or clock signal to trigger receive operation while triggering transmit operation on the non-inverted strobe or clock signal. By adjusting the duty cycle of the strobe signal, the trailing edge of the strobe signal is adjusted relative to the leading edge (the triggering edge) of the strobe signal. By inverting the duty-cycle adjusted strobe signal, the testing creates an inverted strobe signal with a leading edge (the triggering edge) modulated by the change in duty cycle to the trailing edge of the strobe signal. The modulated triggering edge can provide more precise testing signals. In one embodiment, the interface testing includes testing the I/O interface in signal groups, with each signal group accumulating pass/fail information to send to the test system (not shown).

Figure 8:
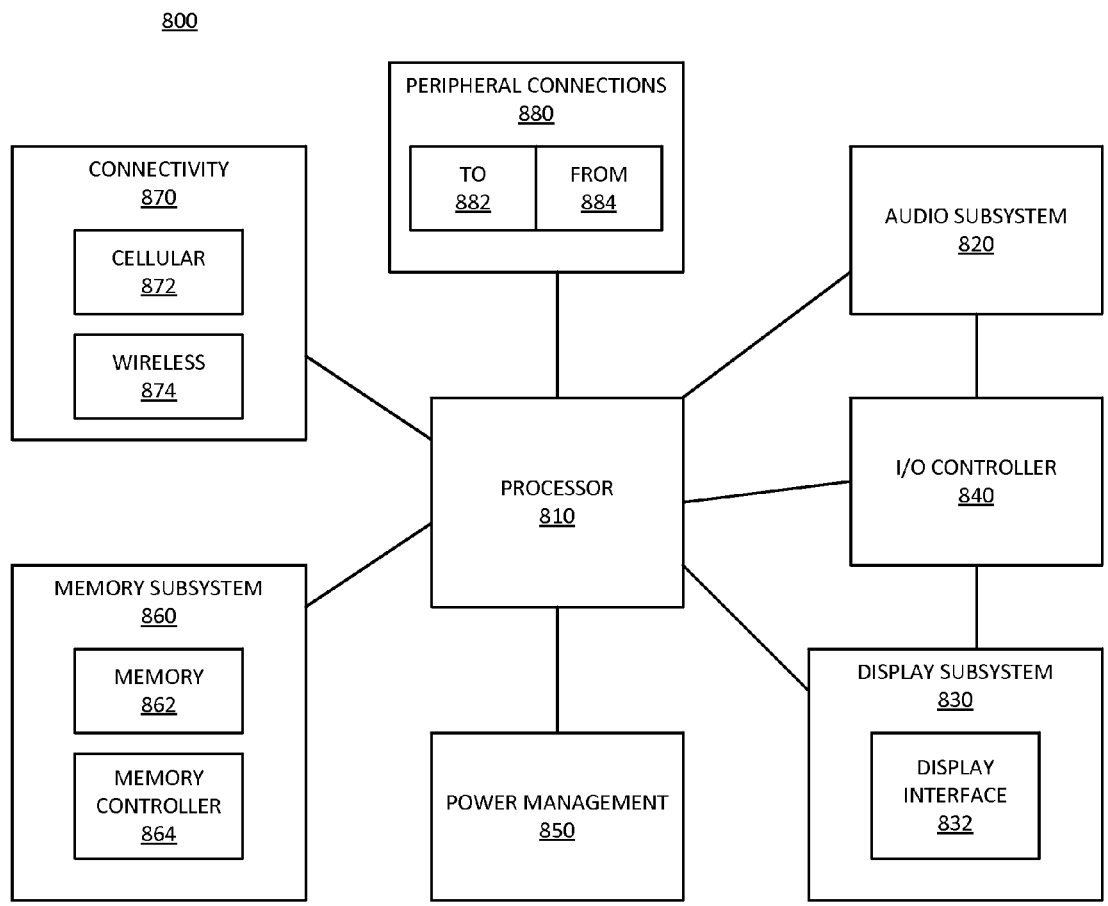
FIG. 8 is a block diagram of an embodiment of a mobile device in which duty cycle based margining can be implemented.

FIG. 8 is a block diagram of an embodiment of a mobile device in which duty cycle based margining can be implemented. Device 800 represents a mobile computing device, such as a computing tablet, a mobile phone or smartphone, a wireless-enabled e-reader, wearable computing device, or other mobile device. It will be understood that certain of the components are shown generally, and not all components of such a device are shown in device 800.

Device 800 includes processor 810, which performs the primary processing operations of device 800. Processor 810 can include one or more physical devices, such as microprocessors, application processors, microcontrollers, programmable logic devices, or other processing means. The processing operations performed by processor 810 include the execution of an operating platform or operating system on which applications and/or device functions are executed. The processing operations include operations related to I/O (input/output) with a human user or with other devices, operations related to power management, and/or operations related to connecting device 800 to another device. The processing operations can also include operations related to audio I/O and/or display I/O.

In one embodiment, device 800 includes audio subsystem 820, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 800, or connected to device 800. In one embodiment, a user interacts with device 800 by providing audio commands that are received and processed by processor 810.

Display subsystem 830 represents hardware (e.g., display devices) and software (e.g., drivers) components that provide a visual and/or tactile display for a user to interact with the computing device. Display subsystem 830 includes display interface 832, which includes the particular screen or hardware device used to provide a display to a user. In one embodiment, display interface 832 includes logic separate from processor 810 to perform at least some processing related to the display. In one embodiment, display subsystem 830 includes a touchscreen device that provides both output and input to a user.

I/O controller 840 represents hardware devices and software components related to interaction with a user. I/O controller 840 can operate to manage hardware that is part of audio subsystem 820 and/or display subsystem 830. Additionally, I/O controller 840 illustrates a connection point for additional devices that connect to device 800 through which a user might interact with the system. For example, devices that can be attached to device 800 might include microphone devices, speaker or stereo systems, video systems or other display device, keyboard or keypad devices, or other I/O devices for use with specific applications such as card readers or other devices.

As mentioned above, I/O controller 840 can interact with audio subsystem 820 and/or display subsystem 830. For example, input through a microphone or other audio device can provide input or commands for one or more applications or functions of device 800. Additionally, audio output can be provided instead of or in addition to display output. In another example, if display subsystem includes a touchscreen, the display device also acts as an input device, which can be at least partially managed by I/O controller 840. There can also be additional buttons or switches on device 800 to provide I/O functions managed by I/O controller 840.

In one embodiment, I/O controller 840 manages devices such as accelerometers, cameras, light sensors or other environmental sensors, gyroscopes, global positioning system (GPS), or other hardware that can be included in device 800. The input can be part of direct user interaction, as well as providing environmental input to the system to influence its operations (such as filtering for noise, adjusting displays for brightness detection, applying a flash for a camera, or other features). In one embodiment, device 800 includes power management 850 that manages battery power usage, charging of the battery, and features related to power saving operation.

Memory subsystem 860 includes memory device(s) 862 for storing information in device 800. Memory subsystem 860 can include nonvolatile (state does not change if power to the memory device is interrupted) and/or volatile (state is indeterminate if power to the memory device is interrupted) memory devices. Memory 860 can store application data, user data, music, photos, documents, or other data, as well as system data (whether long-term or temporary) related to the execution of the applications and functions of system 800. In one embodiment, memory subsystem 860 includes memory controller 864 (which could also be considered part of the control of system 800, and could potentially be considered part of processor 810). Memory controller 864 includes a scheduler to generate and issue commands to memory device 862.

Connectivity 870 includes hardware devices (e.g., wireless and/or wired connectors and communication hardware) and software components (e.g., drivers, protocol stacks) to enable device 800 to communicate with external devices. The external device could be separate devices, such as other computing devices, wireless access points or base stations, as well as peripherals such as headsets, printers, or other devices.

Connectivity 870 can include multiple different types of connectivity. To generalize, device 800 is illustrated with cellular connectivity 872 and wireless connectivity 874. Cellular connectivity 872 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 874 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 880 include hardware interfaces and connectors, as well as software components (e.g., drivers, protocol stacks) to make peripheral connections. It will be understood that device 800 could both be a peripheral device ("to" 882) to other computing devices, as well as have peripheral devices ("from" 884) connected to it. Device 800 commonly has a "docking" connector to connect to other computing devices for purposes such as managing (e.g., downloading and/or uploading, changing, synchronizing) content on device 800. Additionally, a docking connector can allow device 800 to connect to certain peripherals that allow device 800 to control content output, for example, to audiovisual or other systems.

In addition to a proprietary docking connector or other proprietary connection hardware, device 800 can make peripheral connections 880 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one embodiment, one or more circuit components of system 800 include I/O interfaces that are functionally tested with duty cycle based margining to determine a proper I/O eye width. In one embodiment, elements of system 800 are included in an SOC or multichip package tested in parallel with other chips. In one embodiment, the components are tested by a test system that generates an inverted modulated strobe or clock signal to trigger receive operation while triggering transmit operation on the non-inverted strobe or clock signal. By adjusting the duty cycle of the strobe signal, the trailing edge of the strobe signal is adjusted relative to the leading edge (the triggering edge) of the strobe signal. By inverting the duty-cycle adjusted strobe signal, the testing creates an inverted strobe signal with a leading edge (the triggering edge) modulated by the change in duty cycle to the trailing edge of the strobe signal. The modulated triggering edge can provide more precise testing signals. In one embodiment, the interface testing includes testing the I/O interface in signal groups, with each signal group accumulating pass/fail information to send to the test system (not shown).

In one aspect a method for testing an I/O (input/output) interface includes generating a strobe signal as a clock signal to transmit and receive a test data signal, the strobe signal having a triggering edge that triggers a write, and a trailing edge; modulating the trailing edge of the strobe signal by adjusting a duty cycle of the strobe signal; inverting the strobe signal with the modulated trailing edge to generate an inverted strobe signal, wherein the inverted strobe signal has a modulated triggering edge; triggering test data transmitting on the triggering edge of the strobe signal; and triggering test data receiving on the triggering edge of the inverted strobe signal.

In one embodiment, generating further comprises generating a differential strobe signal for a double data rate device, and wherein modulating the trailing edge of the strobe signal further comprises modulating the trailing edge of the strobe signal and its complement, and wherein inverting the strobe signal further comprises generating an inverted complementary strobe signal. In one embodiment, modulating the trailing edge of the strobe signal comprises adjusting a duty cycle of the strobe signal to adjust a skew between test data transmitting and test data receiving to adjust an I/O eye width. In one embodiment, adjusting the duty cycle comprises decreasing the duty cycle to cause the inverted strobe signal to cause the I/O eye width to fail a hold time parameter. In one embodiment, adjusting the duty cycle comprises increasing the duty cycle to cause the inverted strobe signal to cause the I/O eye width to fail a setup time parameter. In one embodiment, the method further comprising offsetting data capture by a delay to test the setup time parameter. In one embodiment, adjusting the duty cycle comprises adjusting the I/O eye width to test a trailing edge of the I/O eye for a first fail condition. In one embodiment, adjusting the duty cycle comprises adjusting the I/O eye width to test a leading edge of the I/O eye for an all pass condition.

In one aspect, a circuit device having an I/O (input/output) interface to be tested includes multiple signal lines that each interfaces to a hardware I/O buffer of the I/O interface, wherein each of the signal lines is to receive bits of a test data signal distributed to the multiple signal lines from a test source; a hardware interface to a strobe signal as a clock signal for the test data signal, the strobe signal having a triggering edge that triggers a write, and a trailing edge, the strobe signal having a duty cycle adjusted to modulate a trailing edge of the strobe signal; and error detection logic to detect I/O errors caused by an I/O eye width violating a timing parameter, including comparing an expected data bit to a data bit written to the I/O buffer based on the triggering edge of the strobe signal and read from the I/O buffer based on an inverted strobe signal that has a modulated triggering edge, wherein the inverted strobe signal is an inverted version of the received strobe signal.

In one embodiment, the strobe signal comprises a differential strobe signal for a double data rate device, and wherein the modulated trailing edge of the strobe signal further comprises a trailing edge of the strobe signal and its complement. In one embodiment, the error detection logic is to detect I/O errors caused by an inverted strobe signal with a selected skew between write triggering and read triggering to set an I/O eye width. In one embodiment, the error detection logic is to test for a hold time parameter violation based on the inverted strobe signal from a strobe signal with a decreased duty cycle, or to test for a setup time parameter violation based on the inverted strobe signal from a strobe signal with an increased duty cycle. In one embodiment, the error detection logic is to further offset data capture by a delay to test the setup time parameter. In one embodiment, the error detection logic is to test a trailing edge of the I/O eye for a first fail condition. In one embodiment, the error detection logic is to test a leading edge of the I/O eye for an all pass condition.

In one aspect, a system having a hardware I/O (input/output) interface to be tested includes a test source to generate a test data sequence; a semiconductor wafer having multiple distinct circuit die processed in the wafer, each circuit die including multiple signal lines that each interfaces to a hardware I/O buffer of the I/O interface, wherein each of the signal lines is to receive bits of a test data signal distributed to the multiple signal lines from a test source; a hardware interface to a strobe signal as a clock signal for the test data signal, the strobe signal having a triggering edge that triggers a write, and a trailing edge, the strobe signal having a duty cycle adjusted to modulate a trailing edge of the strobe signal; and error detection logic to detect I/O errors caused by an I/O eye width violating a timing parameter, including comparing an expected data bit to a data bit written to the I/O buffer based on the triggering edge of the strobe signal and read from the I/O buffer based on an inverted strobe signal that has a modulated triggering edge, wherein the inverted strobe signal is an inverted version of the received strobe signal; wherein the test data sequence is distributed to signal line groups on multiple circuit die on the semiconductor wafer to concurrently, indirectly test the I/O interface of the multiple circuit die.

In one embodiment, the strobe signal comprises a differential strobe signal for a double data rate device, and wherein the modulated trailing edge of the strobe signal further comprises a trailing edge of the strobe signal and its complement. In one embodiment, the error detection logic is to detect I/O errors caused by an inverted strobe signal with a selected skew between write triggering and read triggering to set an I/O eye width. In one embodiment, the error detection logic is to test for a hold time parameter violation based on the inverted strobe signal from a strobe signal with a decreased duty cycle, or to test for a setup time parameter violation based on the inverted strobe signal from a strobe signal with an increased duty cycle. In one embodiment, the error detection logic is to further offset data capture by a delay to test the setup time parameter. In one embodiment, the error detection logic is to test a trailing edge of the I/O eye for a first fail condition. In one embodiment, the error detection logic is to test a leading edge of the I/O eye for an all pass condition.

In one aspect, an article of manufacture comprising a computer readable storage medium having content stored thereon, which when executed performs operations for testing an I/O (input/output) interface, including: generating a strobe signal as a clock signal to transmit and receive a test data signal, the strobe signal having a triggering edge that triggers a write, and a trailing edge; modulating the trailing edge of the strobe signal by adjusting a duty cycle of the strobe signal; inverting the strobe signal with the modulated trailing edge to generate an inverted strobe signal, wherein the inverted strobe signal has a modulated triggering edge; triggering test data transmitting on the triggering edge of the strobe signal; and triggering test data receiving on the triggering edge of the inverted strobe signal.

In one embodiment, the content for generating further comprises content for generating a differential strobe signal for a double data rate device, and wherein the content for modulating the trailing edge of the strobe signal further comprises content for modulating the trailing edge of the strobe signal and its complement, and wherein the content for inverting the strobe signal further comprises content for generating an inverted complementary strobe signal. In one embodiment, the content for modulating the trailing edge of the strobe signal comprises content for adjusting a duty cycle of the strobe signal to adjust a skew between test data transmitting and test data receiving to adjust an I/O eye width. In one embodiment, the content for adjusting the duty cycle comprises content for decreasing the duty cycle to cause the inverted strobe signal to cause the I/O eye width to fail a hold time parameter. In one embodiment, the content for adjusting the duty cycle comprises content for increasing the duty cycle to cause the inverted strobe signal to cause the I/O eye width to fail a setup time parameter. In one embodiment, further comprising content for offsetting data capture by a delay to test the setup time parameter. In one embodiment, the content for adjusting the duty cycle comprises content for adjusting the I/O eye width to test a trailing edge of the I/O eye for a first fail condition. In one embodiment, the content for adjusting the duty cycle comprises content for adjusting the I/O eye width to test a leading edge of the I/O eye for an all pass condition.

In one aspect, an apparatus for testing an I/O (input/output) interface includes means for generating a strobe signal as a clock signal to transmit and receive a test data signal, the strobe signal having a triggering edge that triggers a write, and a trailing edge; means for modulating the trailing edge of the strobe signal by adjusting a duty cycle of the strobe signal; means for inverting the strobe signal with the modulated trailing edge to generate an inverted strobe signal, wherein the inverted strobe signal has a modulated triggering edge; means for triggering test data transmitting on the triggering edge of the strobe signal; and means for triggering test data receiving on the triggering edge of the inverted strobe signal.

In one embodiment, the means for generating further comprises means for generating a differential strobe signal for a double data rate device, and wherein the means for modulating the trailing edge of the strobe signal further comprises means for modulating the trailing edge of the strobe signal and its complement, and wherein the means for inverting the strobe signal further comprises means for generating an inverted complementary strobe signal. In one embodiment, the means for modulating the trailing edge of the strobe signal comprises means for adjusting a duty cycle of the strobe signal to adjust a skew between test data transmitting and test data receiving to adjust an I/O eye width. In one embodiment, the means for adjusting the duty cycle comprises means for decreasing the duty cycle to cause the inverted strobe signal to cause the I/O eye width to fail a hold time parameter. In one embodiment, the means for adjusting the duty cycle comprises means for increasing the duty cycle to cause the inverted strobe signal to cause the I/O eye width to fail a setup time parameter. In one embodiment, further comprising means for offsetting data capture by a delay to test the setup time parameter. In one embodiment, the means for adjusting the duty cycle comprises means for adjusting the I/O eye width to test a trailing edge of the I/O eye for a first fail condition. In one embodiment, the means for adjusting the duty cycle comprises means for adjusting the I/O eye width to test a leading edge of the I/O eye for an all pass condition.

In one aspect, a method for testing an I/O (input/output) interface includes receiving, at a device under test from a test system, a strobe signal as a clock signal to transmit and receive a test data signal, the strobe signal having a triggering edge that triggers a write, and a trailing edge, the strobe signal having a duty cycle adjusted to modulate a trailing edge of the strobe signal; inverting the received strobe signal to generate an inverted strobe signal, wherein the inverted strobe signal has a modulated triggering edge; writing the test data in response to the triggering edge of the strobe signal; and reading the written test data in response to the triggering edge of the inverted strobe signal.

In one embodiment, the receiving further comprises receiving a differential strobe signal for a double data rate device, and wherein inverting the strobe signal further comprises generating an inverted complementary strobe signal. In one embodiment, inverting the received strobe signal comprises generating an inverted strobe signal with a selected skew between test data transmitting and test data receiving to adjust an I/O eye width. In one embodiment, generating the inverted strobe signal comprises generating the inverted strobe signal from a strobe signal with a decreased duty cycle to cause the inverted strobe signal to cause the I/O eye width to fail a hold time parameter. In one embodiment, generating the inverted strobe signal comprises generating the inverted strobe signal a strobe signal with increased duty cycle to cause the inverted strobe signal to cause the I/O eye width to fail a setup time parameter. In one embodiment, further comprising offsetting data capture by triggering a delay prior to reading the written data to test the setup time parameter. In one embodiment, generating the inverted strobe signal comprises generating the inverted strobe signal to adjust the I/O eye width to test a trailing edge of the I/O eye for a first fail condition. In one embodiment, generating the inverted strobe signal comprises generating the inverted strobe signal to adjust the I/O eye width to test a leading edge of the I/O eye for an all pass condition.

In one aspect, an article of manufacture comprising a computer readable storage medium having content stored thereon, which when executed performs operations for testing an I/O (input/output) interface, including: receiving, at a device under test from a test system, a strobe signal as a clock signal to transmit and receive a test data signal, the strobe signal having a triggering edge that triggers a write, and a trailing edge, the strobe signal having a duty cycle adjusted to modulate a trailing edge of the strobe signal; inverting the received strobe signal to generate an inverted strobe signal, wherein the inverted strobe signal has a modulated triggering edge; writing the test data in response to the triggering edge of the strobe signal; and reading the written test data in response to the triggering edge of the inverted strobe signal.

In one embodiment, the content for receiving further comprises content for receiving a differential strobe signal for a double data rate device, and wherein the content for inverting the strobe signal further comprises content for generating an inverted complementary strobe signal. In one embodiment, the content for inverting the received strobe signal comprises content for generating an inverted strobe signal with a selected skew between test data transmitting and test data receiving to adjust an I/O eye width. In one embodiment, the content for generating the inverted strobe signal comprises content for generating the inverted strobe signal from a strobe signal with a decreased duty cycle to cause the inverted strobe signal to cause the I/O eye width to fail a hold time parameter. In one embodiment, the content for generating the inverted strobe signal comprises content for generating the inverted strobe signal a strobe signal with increased duty cycle to cause the inverted strobe signal to cause the I/O eye width to fail a setup time parameter. In one embodiment, further comprising content for offsetting data capture by triggering a delay prior to reading the written data to test the setup time parameter. In one embodiment, the content for generating the inverted strobe signal comprises content for generating the inverted strobe signal to adjust the I/O eye width to test a trailing edge of the I/O eye for a first fail condition. In one embodiment, the content for generating the inverted strobe signal comprises content for generating the inverted strobe signal to adjust the I/O eye width to test a leading edge of the I/O eye for an all pass condition.

In one aspect, an apparatus for testing an I/O (input/output) interface including receiving, at a device under test from a test system, a strobe signal as a clock signal to transmit and receive a test data signal, the strobe signal having a triggering edge that triggers a write, and a trailing edge, the strobe signal having a duty cycle adjusted to modulate a trailing edge of the strobe signal; inverting the received strobe signal to generate an inverted strobe signal, wherein the inverted strobe signal has a modulated triggering edge; writing the test data in response to the triggering edge of the strobe signal; and reading the written test data in response to the triggering edge of the inverted strobe signal.

In one embodiment, the means for receiving further comprises means for receiving a differential strobe signal for a double data rate device, and wherein the means for inverting the strobe signal further comprises means for generating an inverted complementary strobe signal. In one embodiment, the means for inverting the received strobe signal comprises means for generating an inverted strobe signal with a selected skew between test data transmitting and test data receiving to adjust an I/O eye width. In one embodiment, the means for generating the inverted strobe signal comprises means for generating the inverted strobe signal from a strobe signal with a decreased duty cycle to cause the inverted strobe signal to cause the I/O eye width to fail a hold time parameter. In one embodiment, the means for generating the inverted strobe signal comprises means for generating the inverted strobe signal a strobe signal with increased duty cycle to cause the inverted strobe signal to cause the I/O eye width to fail a setup time parameter. In one embodiment, further comprising means for offsetting data capture by triggering a delay prior to reading the written data to test the setup time parameter. In one embodiment, the means for generating the inverted strobe signal comprises means for generating the inverted strobe signal to adjust the I/O eye width to test a trailing edge of the I/O eye for a first fail condition. In one embodiment, the means for generating the inverted strobe signal comprises means for generating the inverted strobe signal to adjust the I/O eye width to test a leading edge of the I/O eye for an all pass condition.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A method for testing an I/O (input/output) interface, comprising:

generating a strobe signal as a clock signal to transmit and receive a test data signal, the strobe signal having a triggering edge that triggers a write, and a trailing edge;

modulating the trailing edge of the strobe signal by adjusting a duty cycle of the strobe signal;

inverting the strobe signal with the modulated trailing edge to generate an inverted strobe signal, wherein the inverted strobe signal has a modulated triggering edge;

triggering test data transmitting on the triggering edge of the strobe signal; and triggering test data receiving on the triggering edge of the inverted strobe signal.

2. The method of claim 1, wherein generating further comprises generating a differential strobe signal for a double data rate device, and wherein modulating the trailing edge of the strobe signal further comprises modulating the trailing edge of the strobe signal and its complement, and wherein inverting the strobe signal further comprises generating an inverted complementary strobe signal.

3. The method of claim 1, wherein modulating the trailing edge of the strobe signal comprises adjusting a duty cycle of the strobe signal to adjust a skew between test data transmitting and test data receiving to adjust an I/O eye width.

4. The method of claim 3, wherein adjusting the duty cycle comprises decreasing the duty cycle to cause the inverted strobe signal to cause the I/O eye width to fail a hold time parameter.

5. The method of claim 3, wherein adjusting the duty cycle comprises increasing the duty cycle to cause the inverted strobe signal to cause the I/O eye width to fail a setup time parameter.

6. The method of claim 5, further comprising offsetting data capture by a delay to test the setup time parameter.

7. The method of claim 3, wherein adjusting the duty cycle comprises adjusting the I/O eye width to test a trailing edge of the I/O eye for a first fail condition.

8. The method of claim 3, wherein adjusting the duty cycle comprises adjusting the I/O eye width to test a leading edge of the I/O eye for an all pass condition.

9. The method of claim 1, wherein the triggering edge of the strobe signal comprises a rising edge of the strobe signal and the trailing edge of the strobe signal comprises a falling edge of the strobe signal.

10. A circuit device having an I/O (input/output) interface, the circuit device comprising:

multiple signal lines to interface with a hardware I/O buffer of the I/O interface, wherein the signal lines are to receive bits of a test data signal distributed to the multiple signal lines from a test source;

a hardware interface to a strobe signal as a clock signal for the test data signal, the strobe signal including a triggering edge to trigger a write, and a trailing edge, the strobe signal having a duty cycle to be adjusted to modulate the trailing edge of the strobe signal; and error detection logic to detect an I/O error as a result of an I/O eye width violation of a timing parameter, including the error detection logic to compare an expected data bit to a data bit to be written to the I/O buffer based on the triggering edge of the strobe signal and to be read from the I/O buffer based on an inverted signal with a modulated triggering edge, wherein the inverted signal to be an inverted version of the strobe signal.

11. The circuit device of claim 10, wherein the error detection logic is to detect an I/O error as a result of an inverted strobe signal with a selected skew between write triggering and read triggering to set an I/O eye width.

12. The circuit device of claim 11, wherein the error detection logic is to test for a hold time parameter violation based on the inverted strobe signal from a strobe signal with a decreased duty cycle, or to test for a setup time parameter violation based on the inverted strobe signal from a strobe signal with an increased duty cycle.

13. The circuit device of claim 11, wherein the error detection logic is to test a trailing edge of the I/O eye for a first fail condition and a leading edge of the I/O eye for an all pass condition.

14. The circuit device of claim 10, wherein the triggering edge of the strobe signal comprises a rising edge of the strobe signal and the trailing edge of the strobe signal comprises a falling edge of the strobe signal.

15. A system comprising:

a test source to generate a test data sequence;

a semiconductor wafer having multiple distinct circuit die processed in the wafer, the multiple distinct circuit die including multiple signal lines to interface with a hardware I/O (input/output) buffer of the I/O interface, wherein the signal lines are to receive bits of a test data signal distributed to the multiple signal lines from a test source;

a hardware interface to a strobe signal as a clock signal for the test data signal, the strobe signal including a triggering edge to trigger a write, and a trailing edge, the strobe signal having a duty cycle to be adjusted to modulate the trailing edge of the strobe signal; and error detection logic to detect an I/O error as a result of an I/O eye width violation of a timing parameter, including the error detection logic to compare an expected data bit to a data bit to be written to the I/O buffer based on the triggering edge of the strobe signal and to be read from the I/O buffer based on an inverted signal with a modulated triggering edge, wherein the inverted signal to be an inverted version of the strobe signal;

wherein the test data sequence is to be distributed to signal line groups on multiple circuit die on the semiconductor wafer to concurrently, indirectly test the I/O interface of the multiple circuit die.

16. The system of claim 15, wherein the error detection logic is to detect an I/O error as a result of an inverted strobe signal with a selected skew between write triggering and read triggering to set an I/O eye width.

17. The system of claim 16, wherein the error detection logic is to test for a hold time parameter violation based on the inverted strobe signal from a strobe signal with a decreased duty cycle, or to test for a setup time parameter violation based on the inverted strobe signal from a strobe signal with an increased duty cycle.

18. The system of claim 16, wherein the error detection logic is to test a trailing edge of the I/O eye for a first fail condition and a leading edge of the I/O eye for an all pass condition.

19. The system of claim 15, wherein the triggering edge of the strobe signal comprises a rising edge of the strobe signal and the trailing edge of the strobe signal comprises a falling edge of the strobe signal.

20. A method for testing an I/O (input/output) interface, comprising:

receiving, at a device under test from a test system, a strobe signal as a clock signal to transmit and receive a test data signal, the strobe signal having a triggering edge that triggers a write, and a trailing edge, the strobe signal having a duty cycle adjusted to modulate a trailing edge of the strobe signal;

inverting the received strobe signal to generate an inverted strobe signal, wherein the inverted strobe signal has a modulated triggering edge;

writing the test data in response to the triggering edge of the strobe signal; and reading the written test data in response to the triggering edge of the inverted strobe signal.

21. The method of claim 20, wherein inverting the received strobe signal comprises generating an inverted strobe signal with a selected skew between test data transmitting and test data receiving to adjust an I/O eye width.

22. The method of claim 21, wherein generating the inverted strobe signal comprises generating the inverted strobe signal from a strobe signal with a decreased duty cycle to cause the inverted strobe signal to cause the I/O eye width to fail a hold time parameter, or from a strobe signal with increased duty cycle to cause the inverted strobe signal to cause the I/O eye width to fail a setup time parameter.

23. The method of claim 21, wherein generating the inverted strobe signal comprises generating the inverted strobe signal to adjust the I/O eye width to test a trailing edge of the I/O eye for a first fail condition and a leading edge of the I/O eye for an all pass condition.

24. The method of claim 20, wherein the triggering edge of the strobe signal comprises a rising edge of the strobe signal and the trailing edge of the strobe signal comprises a falling edge of the strobe signal.

\* \* \* \* \*